United States Patent [19]
Baldwin et al.

[11] Patent Number: 5,982,284
[45] Date of Patent: Nov. 9, 1999

[54] TAG OR LABEL WITH LAMINATED THIN, FLAT, FLEXIBLE DEVICE

[75] Inventors: John Baldwin; Edward Carothers; Terrell Hill; Peter Kuzma, all of Philadelphia, Pa.

[73] Assignee: Avery Dennison Corporation, Pasadena, Calif.

[21] Appl. No.: 09/037,735

[22] Filed: Mar. 10, 1998

Related U.S. Application Data

[63] Continuation-in-part of application No. 08/933,948, Sep. 19, 1997, abandoned.

[51] Int. Cl.[6] .................................................. G08B 13/14
[52] U.S. Cl. .................................. 340/572.8; 340/572.7; 340/572.1; 343/895; 29/829; 361/752
[58] Field of Search ........................... 340/572.8, 572.7, 340/572.1, 551, 825.54, 572.6; 343/895, 872, 873; 361/751, 752, 758; 235/487, 492; 600/444; 29/829, 832, 841, 850, 855; 156/299; 428/349, 41.9

[56] References Cited

U.S. PATENT DOCUMENTS

| | | | |
|---|---|---|---|
| 3,239,478 | 3/1966 | Harlan, Jr. | 428/349 |
| 4,510,490 | 4/1985 | Anderson, III et al. | 340/572.1 |
| 4,725,924 | 2/1988 | Juan | 361/751 |
| 5,006,856 | 4/1991 | Benge et al. | 340/572.3 |
| 5,291,180 | 3/1994 | Reed | 340/572.5 |
| 5,427,099 | 6/1995 | Adams | 600/414 |
| 5,560,970 | 10/1996 | Ludebühl | 428/41.9 |
| 5,574,470 | 11/1996 | De Vall | 343/895 |
| 5,583,489 | 12/1996 | Loemker et al. | 340/572.8 |
| 5,708,419 | 1/1998 | Isaacson et al. | 340/572.5 |
| 5,790,029 | 8/1998 | Curnutte et al. | 340/572.1 |
| 5,838,253 | 11/1998 | Wurz et al. | 340/825.54 |

*Primary Examiner*—Benjamin C. Lee
*Attorney, Agent, or Firm*—Venable Robert Kinberg

[57] ABSTRACT

A tag or label includes first and second sheets having facing sides. A thin, flat, flexible device is disposed between the facing sides of the first and second sheets and has opposing flat surfaces meeting at a perimeter surrounding the device. An adhesive fixes the facing sides of the first and second sheets to the opposing flat surfaces of the device and to one another except in an adhesion-free region, where the adhesion-free region is a frame-shaped adhesion-free region surrounding the perimeter of the device or a polygon-shaped adhesion-free region inside the perimeter of the device.

32 Claims, 2 Drawing Sheets

TAG OR LABEL WITH LAMINATED THIN, FLAT, FLEXIBLE DEVICE

CROSS-REFERENCE TO RELATED APPLICATIONS

This application is a continuation-in-part of U.S. patent application Ser. No. 08/933,948, filed Sep. 19, 1997, now abandoned "Tag with Laminated Thin, Flat, Flexible Device," by John Baldwin, Edward Carothers, Terrell Hill, and Peter Kuzma, which is herein incorporated by reference.

BACKGROUND OF THE INVENTION

The present invention relates to an anti-theft tag or label of the type that is attached to a product and includes a thin electronic device laminated between outer sheets of the tag. The tag or label may be printed on one or both sides with graphics and/or variable product information, such as price, inventory number, etc., some of which may be represented by a bar code. Various electronic devices are known which can be laminated into a tag or label to assist in preventing theft. Such electronic devices are generally printed circuit devices that transmit and/or receive a signal for setting of an alarm when in proximity of a compatible detector. Alternatively or in addition, the electronic device may include electronic memory that contains product information that can be encoded into a signal used to identify the product when the signal is decoded by an appropriate decoding receiver. Such electronic devices, which will be collectively referred to herein as "electronic protection devices," are commercially available and do not, per se, comprise the present invention. They have the common characteristic that they comprise a thin, flat, flexible electronic device having a thickness which is a small fraction of an inch. It is desirable to laminate such a device between the outer sheets of the tag in a manner that is relatively undetectable to the casual observer.

A problem in this regard has arisen in that although the known electronic protection devices are relatively thin, the edge at the perimeter of the device presents a step relative to the sheets laminated on both sides of the device. This step becomes noticeable as a wrinkle in the outer sheets of the tag, which sheets are laminated together with the electronic protection device sandwiched in between. Not only does this give away the presence of the electronic protection device that is laminated into the tag, but it additionally presents problems for legible printing of the variable information on the tag. Further, if the wrinkle is in the area where bar code information is printed, the bar code may be rendered unreadable or readable with error.

Another similar problem may occur in the case of thin, flat, flexible electronic devices which incorporate a relatively bulky component. Such as component can create a bulging area, and a resulting wrinkle in the other sheets of a tag incorporating such a device.

SUMMARY OF THE INVENTION

It is an object of the invention to provide a tag or label that has a thin, flat, flexible device laminated between outer sheets of the tag or label in such a manner that the edges of the device are masked in the lamination so as not to give away the presence of the device.

It is another object of the invention to provide an anti-theft tag or label which minimizes evidence of the presence of an electronic protection device laminated within the tag or label.

It is a further object of the invention to provide an anti-theft tag or label that has an electronic protection device laminated therein that does not interfere with variable information printed on outer surfaces of the tag or label.

It is a more particular object of the invention to mask the step presented by the edge at the outer perimeter of the electronic protection device relative to the sheets laminated on both sides of the electronic protection device.

It is a further object of the invention to provide improved tags or labels incorporating thin, flat, flexible electronic devices having a relatively bulky portion. The invention seeks to mask a bulging area which may occur in a bulging region created by such a bulky portion.

The above and other objects are accomplished according to the invention by the provision of a tag or label, comprising: first and second sheets having facing sides; a thin, flat, flexible electronic device disposed between the facing sides of the first and second sheets and having opposing flat surfaces meeting at a perimeter surrounding the device; and an adhesive fixing the facing sides of the first and second sheets to the opposing flat surfaces of the device and to one another, except in an adhesion-free region.

The adhesion-free region can be: a region extending beyond the perimeter of the electronic device; a region extending both continuously beyond the perimeter of the electronic device, and within the perimeter of the electronic device; a region located entirely within the perimeter of the electronic device; a region located at a relatively bulky portion of the electronic device; a continuous region; a frame-shaped region immediately surrounding the perimeter of the device; or a polygon-shaped region inside the perimeter of the device.

In a preferred embodiment of the invention, a pressure-sensitive adhesive which is coated on the side of each sheet facing the respective sides of the device is deactivated by an adhesive-deadening film disposed in an adhesion-free region on the adhesive on one of the sheets. For the frame-shaped region, the device is fixed to the adhesive so that the edge at the perimeter of the device is on the frame of adhesive-deadening film which is thus exposed a distance beyond the perimeter of the device so that the two sheets are laminated together except in a frame-shaped region immediately surrounding the device. This creates a small air gap around the perimeter of the device which eliminates the wrinkle that would otherwise be created by the edge of the device when the outer sheets are laminated together. The air gap in effect masks the edge of the device which makes the presence of the device less detectable and avoids the above-discussed problems in printing and/or reading the information printed on the tag or label. The masking is achieved in part because the air gap allows the sheets laminated to the device to move small amounts relative to the tag in the vicinity of the edges when the tag or label is flexed.

For the polygon-shaped region inside the perimeter of the device, the same air gap effect occurs around a bulging area of the device. Such a bulging area typically results from a relatively bulky portion of the electronic device, such as an integrated circuit.

DETAILED DESCRIPTION OF THE INVENTION

Figure 1:
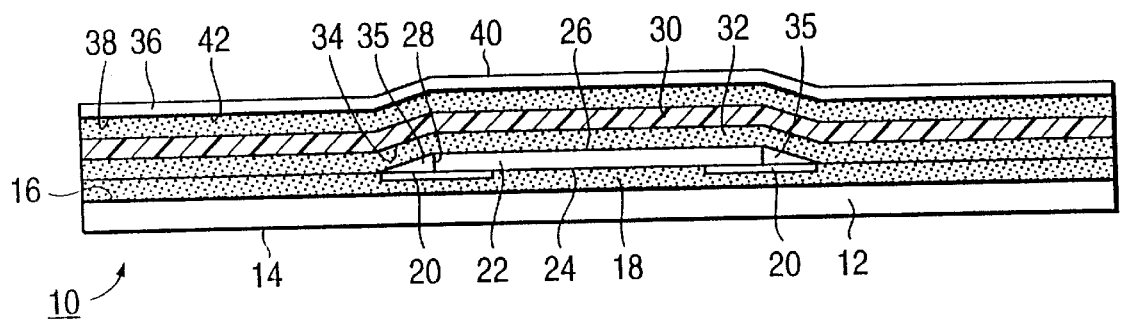
FIG. 1 is a cross-sectional view showing a tag according to the invention.
Figure 2:
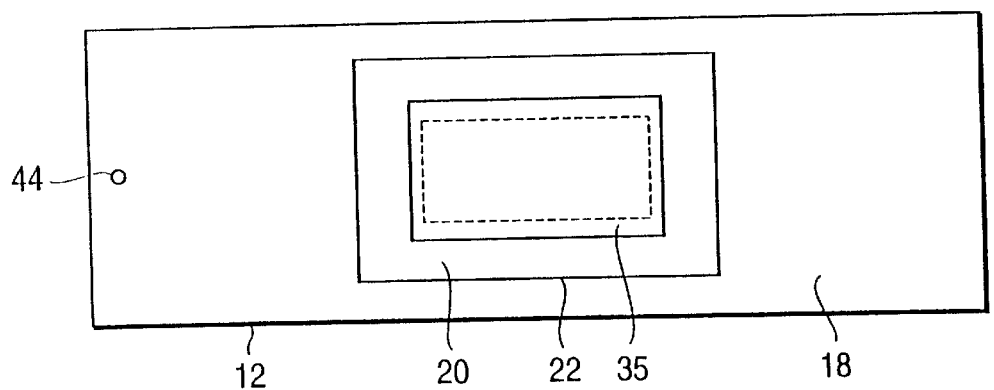
FIG. 2 is shows a plan view of the tag in FIG. 1 with the top sheet(s) removed.

Referring to FIGS. 1 and 2, there is shown a tag 10 according to the invention which includes a first sheet 12 having a first, exposed side 14 which is suitable for printing graphics and/or variable print information, for example, by thermal transfer printing, and a second side 16 having a layer 18 of permanent adhesive, such as a conventional pressure-sensitive adhesive coated thereon. An adhesive-deadening film 20 is applied to adhesive layer 18 in a frame-shaped region to deactivate the adhesive and create an adhesion-free region. A thin, flat, and flexible device 22, which could be an electronic protection device, for example in the form of a printed circuit laminated between insulating sheets of paper, has opposite surfaces 24 and 26 which meet at an outer edge 28 surrounding the perimeter of device 22. Surface 24 is fixed to side 14 of sheet 12 by adhesive layer 18, with outer edge 28 being disposed within the frame-shaped region of adhesive-deadening film 20, so that at least a portion of adhesive-deadening film 20 extends outwardly beyond outer edge 28 of device 22. Preferably, a second sheet comprising a tear-resistant film 30, such as 3.0 mil VALERON film sold by Van Lear Flexibles, Inc., Houston, Tex., is laminated to the top surface 26 of device 22 and to sheet 12 by a permanent adhesive layer 32 coated onto a side 34 of tear-resistant film 30 facing device 22. A small air pocket 35 is created just outside outer edge 28 due to adhesive-deadening film 20 which prevents adhesive layer 32 from bonding to adhesive layer 18 in the frame-shaped region of film 20. Outside of the frame-shaped region of adhesive-deadening film 20, adhesive layer 32 bonds to adhesive layer 18 to form a unitary adhesive layer between tear-resistant film 30 and sheet 12. Finally, a third sheet 36 having opposite sides 38 and 40 is laminated to tear-resistant film 30 by another adhesive layer 42 coated on side 38 of third sheet 36. Preferably, side 40 is suitable for printing variable information similar to side 14 of sheet 12.

Figure 3:
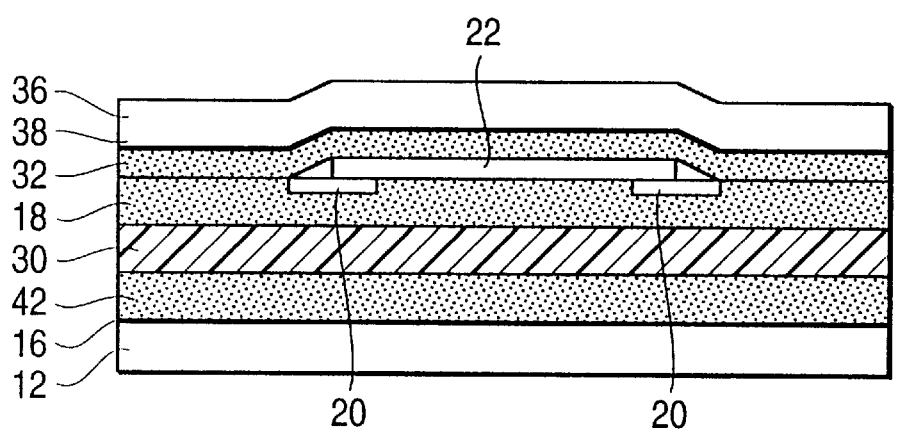
FIG. 3 is a cross-sectional view showing a tag according to another embodiment of the invention.

Alternatively, as shown in FIG. 3, tear-resistant film 30 and adhesive layer 42 may be sandwiched between sheet 12 and adhesive layer 18 (FIG. 3), instead of between sheet 36 and adhesive layer 32 (FIG. 1).

Sheets 12 and 36 may comprise, for example, a 60 lb paper face stock material that is printable with graphics and/or variable print information, or a 50 pounds-per-ream paper stock, such as that sold under the trademark TRANSTHERM 1C by Avery Dennison Corporation, Concord, Ohio.

Sheets 12 and 36 preferably include an opaque barrier which is indicated in FIG. 1 by the heavy lines representing surface 16 of sheet 12 and surface 38 of sheet 36. The opaque barrier is preferably an opaque coating or a masking film, and is a grey color, water-based emulsion blockout with high opacity and hiding power.

The adhesive for adhesive layers 18, 32, and 42 may comprise a commercially available pressure-sensitive adhesive, for example, a pressure-sensitive adhesive based upon an emulsion acrylic technology. A suitable adhesive for this purpose is included as part of a pressure-sensitive adhesive paper label stock, sold by Avery Dennison Corporation under the FASCOVER trademark. The adhesive layer 32 may also comprise an approximately 20–30 gm/ream layer of hot melt pressure-sensitive adhesive, such as the S-246 hot melt sold by Avery Dennison, or the H2187-01 hot melt pressure-sensitive adhesive sold by Ato Findley, Inc., Wauwatusa, Wis., or the adhesive compositions taught in U.S. Pat. No. 3,239,478 to Harlan, Jr. Instead of a hot melt, the adhesive layer 32 may comprise a cross-linked acrylic adhesive.

An example of an adhesive-deadening film 20 that may be used to implement the invention and create an adhesion-free region may comprise any of the well known UV curable varnishes that are commercially available for this purpose, for example, the Matte varnish made by AKZO Nobel and sold under part No. UVF9301. Such a UV curable varnish may be applied by a variety of methods, including, but not limited to screen printing, stamping and painting, possibly with the use of a mask. Instead of using a UV curable silicone-based varnish, the deadening film 20 can be polyethyleneimine octadecyl (stearyl) carbamide (PEOC), or polyvinyl octadecyl (stearyl) carbamate (PVOC). Instead of using a chemical release agent for the deadening film 20, a rough surface can be created in the frame area to reduce adhesion and create an adhesion-free region.

After the adhesion-free region is created, device 22 is fixed to the adhesive layer 18 on sheet 12 with its outer edge 28 located on the frame-shaped adhesion-free region around the entire perimeter of the device. Remaining sheets 30 and 36 are laminated in the order discussed employing conventional lamination techniques, which may include, for example, passing the sheets over multiple lamination rollers as will be understood by those skilled in the art.

It is possible to implement the invention with the omission of the tear-resistant film 30. In such a case, outer sheet 36 would be laminated directly to the device in place of the tear-resistant film 30, with the air gap 35 being formed in the same manner as discussed above.

Any type of thin, flat, and flexible device can be laminated into the tag of the invention. In one particular application, the device laminated between the outer sheets comprises an electronic device, and more particularly an electronic protection device as previously discussed. The purpose of the invention is to mask the edges of a thin, flat, flexible device or, alternatively, a bulging region of such a device, by virtue of the small air gap that is created around the device or the bulging region. In the preferred embodiment, this air gap is created by the presence of the adhesive-deadening film 20. It would be possible within the scope of the invention to create the air gap around the device by other techniques. For example, by applying the adhesive to the sheets laminated to the device, except in an area shaped in a frame, an adhesion-free region is created in the shape of a frame around the device, where the adhesion-free region has no adhesive.

An example of a known electronic protection device which could be laminated into the tag to create an anti-theft tag is known as an electronic article surveillance (EAS) device and is sold under the trademark CHECKPOINT by Checkpoint Systems, Inc., Thorofare, N.J. This type of EAS device is known in particular as a swept RF device, which is an active device that responds by modulating an incoming RF signal. The swept RF EAS device comprises a planar conductive material cut into a pair of inverse first and second spiral conductors wrapped about each other and positioned for capacitive and inductive coupling. The two spiral conductors are positioned relative to one another to produce a resonant circuit. The conductors of each circuit are connected by welding to produce a resonant circuit. The swept RF device preferably includes a deactivator. The deactivator includes a composite strip with a conductive layer, a normally nonconductive layer adhered to the conductive layer, and a coating surrounding the adhered layers. The deactivator is positioned in proximity to the resonant circuit so that, when excess energy is applied to the deactivator, the normally non-conductive layer becomes conductive and the coating is rendered ineffective, whereby the resonant circuit is deactivated. The swept RF EAS devices typically have a square or rectangular shape with an area of 1.5 square inches to 5 square inches with thickness varying between 3.5 mils and 9 mils, depending on whether a support material is laminated to the circuit. With a swept RF EAS device, the tag thickness is increased by 2 to 5 mils, depending on the liner and adhesive coating weight used.

The invention provides an adhesion-free region as a non-bondable frame around the device 22 formed by the adhesive-deadening film 20. When the cover sheets 12 and 36 are laminated to the device 22, they are not bonded to the frame-shaped region around the device 22. The angle between the cover sheets 12 and 36 caused by the non-bondable frame and the device 22 depends on the thickness of the device 22 and the distance that the non-bondable frame extends from the device 22. The area of the non-bondable frame is dependent on the maximum thickness constraint of the total construction, the thickness of the device 22, the thickness and flexibility of the cover sheets 12 and 36, and the degree of bend to which the construction of the tag is exposed. One example pursuant to the invention comprises a device 22 with a thickness of 8.5 mils, cover sheets 12 and 36 each with a thickness of 4 mils, and a degree of bend in the construction of the tag dictated by 3-inch diameter roller cores used to construct the tag. In this case, based on actual trials, the non-bondable frame needs to extend a minimum of 0.125 inches from the edges of the device 22. In general, as the inventors have discovered, when the tag is laminated using rollers, if the diameter of the roller core is small, the frame region needs to be large, and if the diameter of the roller core is larger, the frame can be smaller.

An additional example of an electronic protection device is a radio frequency identification (RFID) device, which includes a foil antenna coil and an integrated circuit, or "chip." A typical RFID device is approximately 50 mm by 50 mm square, or approximately 50 mm by 85 mm rectangular. The foil antenna coil has a thickness of approximately 80 μm, and the chip position has a thickness of approximately 375 μm. Commercially available RFID devices are sold under the trademark TIRIS by Texas Instruments, Dallas, Tex., and under the trademark SINGLE CHIP RFID, by Single Chip Systems, San Diego, Calif.

Figure 4:
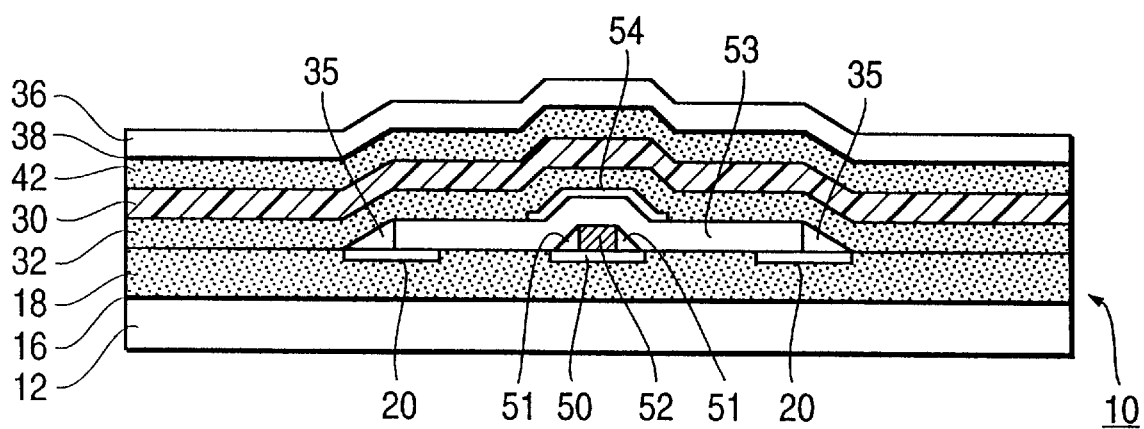
FIG. 4 is a cross-sectional view showing a tag according to a further embodiment of the invention.

Due to the thickness of the typical RFID device at the chip position, a relatively bulky portion of the device creates a bulging region of the device, and a wrinkle will develop in the outer sheets of the tag if the RFID device is laminated using the conventional approach. Using the invention, as shown in FIG. 4, an additional adhesion-free region is formed using adhesive-deadening film 50, which creates an air pocket 51 around the chip 52 of the RFID device. The adhesion-free region created by the adhesive-deadening film 50 is preferably polygon-shaped to mimic the perimeter shape of the chip 52, and is typically square-shaped or rectangular-shaped because the chip 52 is typically square-shaped or rectangular-shaped. The polygon-shaped adhesion-free region of the adhesive-deadening film 50 extends beyond the perimeter of the chip 52 such that no wrinkle develops in either sheets 12 or 36. In addition to or instead of the adhesive-deadening film 50, another adhesion-free region can be formed using adhesive-deadening film 54 on the side of the RFID device opposite the chip 52 to deter the development of a wrinkle in either sheets 12 or 36. The adhesion-free region formed by the adhesive-deadening film 20 creates an air pocket 35 in a frame-shaped region around the perimeter of the foil antenna coil 53 of the RFID device. If the foil antenna coil 53 is thin enough so that no wrinkle develops in either of sheets 12 or 36, the adhesion-free region formed by the adhesive-deadening film 20 is not required. Adhesion-free regions can also be created without using adhesive-deadening films 50 and 54 by using the various techniques described above with respect to creating the adhesion-free regions shown in FIGS. 1–3.

The anti-theft tag is applied to a product by conventional methods. For example, if the product is a garment, the tag could by attached by passing a string through a hole 44 provided in the tag and affixing the string to a button on a garment or looping the string through a button hole.

Alternatively, the tag can be configured as a label to be affixed to a product with an adhesive, as is well known in the art.

It should be obvious that the thicknesses of the layers in FIGS. 1, 3, and 4 are exaggerated for purposes of explanation. The slope that appears in sheet 36 on each side of the device 22 in FIGS. 1 and 3 and the slopes that appear in sheet 36 on each side of the chip 52 and the foil antenna coil 53 in FIG. 4 are in actuality very gradual, and would be barely visibly perceptible, if at all.

The invention has been described in detail with respect to preferred embodiments, and it will now be apparent from the foregoing to those skilled in the art that changes and modifications may be made without departing from the invention in its broader aspects, and the invention, therefore, as defined in the appended claims is intended to cover all such changes and modifications as fall within the true spirit of the invention.

What is claimed is:

1. A tag or label, comprising:
   first and second sheets having facing sides;
   a thin, flat, flexible electronic device disposed between the facing sides of the first and second sheets and having opposing flat surfaces meeting at a perimeter surrounding the electronic device; and
   an adhesive fixing the facing sides of the first and second sheets to the opposing flat surfaces of the device and to one another, except in an adhesion-free region.

2. The tag or label of claim 1, wherein the adhesion-free region extends beyond the perimeter of the electronic device.

3. The tag or label of claim 2, wherein the adhesion-free region extends continuously beyond and within the perimeter of the electronic device.

4. The tag or label of claim 1, wherein the adhesion-free region is located entirely within the perimeter of the electronic device.

5. The tag or label of claim 1, wherein the adhesion-free region is located at a relatively bulky portion of the electronic device.

6. The tag or label of claim 1, wherein the adhesion-free region is a continuous adhesion-free region.

7. The tag or label of claim 1, wherein the adhesion-free region is a frame-shaped region immediately surrounding the perimeter of the device.

8. The tag or label of claim 1, wherein the adhesion-free region is a polygon-shaped region inside the perimeter of the device.

9. The tag or label of claim 1, wherein the tag or label is applied to a product, and the electronic device transmits or receives a wireless signal.

10. The tag or label of claim 1, wherein an air gap is entrained between the first and second sheets in the region.

11. The tag or label of claim 1, wherein the adhesive comprises a layer of pressure-sensitive adhesive coated on each of the facing sides of the first and second sheets, and further including an adhesive-deadening film coated on one of the layers of pressure-sensitive adhesive in the adhesion-free region.

12. The tag or label of claim 11, wherein the adhesive-deadening film comprises a UV curable varnish.

13. The tag or label of claim 1, wherein the adhesion-free region is formed by an absence of adhesive.

14. The tag or label of claim 1, wherein the second sheet comprises an anti-tear material.

15. The tag or label of claim 14, wherein the second sheet has a second side opposite the side fixed to the device, and further including a third sheet fixed to the second side of the second sheet, at least one of the first and third sheets having an exposed surface that is printable with graphics or variable information.

16. The tag or label of claim 15, wherein each of the first and third sheets includes an opaque barrier.

17. The tag or label of claim 1, wherein at least one of the first and second sheets includes an opaque barrier.

18. An anti-theft tag or label for being attached to a product, comprising:
an electronic device for wireless transmission of a signal, the electronic device having opposing flat surfaces meeting at a perimeter surrounding the electronic device;
first and second sheets each having one side coated with a layer of pressure-sensitive adhesive, the one side of each sheet fastened to a respective one of the opposing surfaces of the electronic device and to the one side of the other sheet;
means for deadening the adhesive on at least one of the first and second sheets to form an adhesion-free region.

19. The tag or label of claim 18, wherein the adhesion-free region extends beyond the perimeter of the electronic device.

20. The tag or label of claim 19, wherein the adhesion-free region extends continuously beyond and within the perimeter of the electronic device.

21. The tag or label of claim 18, wherein the adhesion-free region is located entirely within the perimeter of the electronic device.

22. The tag or label of claim 18, wherein the adhesion-free region is located at a relatively bulky portion of the electronic device.

23. The tag or label of claim 18, wherein the adhesion-free region is a continuous adhesion-free region.

24. The anti-theft tag or label of claim 18, wherein the adhesion-free region is a frame-shaped adhesion-free region having an outer perimeter spaced from the perimeter of the electronic device and an inner perimeter extending inwardly at least to the perimeter of the electronic device.

25. The anti-theft tag or label of claim 18, wherein the adhesion-free region is a polygon-shaped adhesion-free region within the perimeter of the electronic device.

26. The anti-theft tag or label of claim 18, wherein the adhesive-deadening means comprises an adhesive-deadening film coated on one of the layers of pressure-sensitive adhesive of one of the sheets.

27. The anti-theft tag or label of claim 26, wherein the adhesive-deadening film comprises a UV varnish.

28. The anti-theft tag or label of claim 18, wherein the adhesive-deadening means comprises refraining from applying adhesive in the adhesion-free region.

29. The anti-theft tag or label of claim 18, wherein the second sheet comprises an anti-tear material.

30. The anti-theft tag or label of claim 29, wherein the second sheet has a second side opposite the one side coated with pressure-sensitive material, and further including a third sheet fixed to the second side of the second sheet, at least one of the first and third sheets having an exposed surface that is printable with graphics or variable information.

31. The anti-theft tag or label of claim 29, wherein each of the first and third sheets includes an opaque barrier.

32. The anti-theft tag or label of claim 18, wherein at least one of the first and second sheets includes an opaque barrier.

* * * * *